(12) United States Patent
Rajavel et al.

(10) Patent No.: US 10,361,333 B1
(45) Date of Patent: Jul. 23, 2019

(54) HIGH PERFORMANCE OR WAVELENGTH CONFIGURABLE DETECTOR

(71) Applicant: HRL Laboratories, LLC, Malibu, CA (US)

(72) Inventors: Rajesh D. Rajavel, Oak Park, CA (US); Hasan Sharifi, Agoura Hills, CA (US); Terence J. DeLyon, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 46 days.

(21) Appl. No.: 15/235,010

(22) Filed: Aug. 11, 2016

Related U.S. Application Data

(60) Provisional application No. 62/204,124, filed on Aug. 12, 2015.

(51) Int. Cl.
*H01L 31/0352* (2006.01)
*H01L 31/101* (2006.01)
*H01L 27/146* (2006.01)

(52) U.S. Cl.
CPC .... *H01L 31/1013* (2013.01); *H01L 27/14652* (2013.01); *H01L 31/035236* (2013.01)

(58) Field of Classification Search
CPC .................. H01L 31/035236; H01L 27/14652
See application file for complete search history.

(56) References Cited

U.S. PATENT DOCUMENTS

| | | | |
|---|---|---|---|
| 5,113,076 A | 5/1992 | Schulte | |
| 5,563,423 A | 10/1996 | Wu et al. | |
| 5,995,529 A | 11/1999 | Kurtz et al. | |
| 6,465,860 B2 * | 10/2002 | Shigenaka | H01L 27/14652 250/338.4 |
| 6,803,557 B1 | 10/2004 | Taylor et al. | |
| 7,041,978 B2 * | 5/2006 | Gravrand | H01L 27/14649 250/336.1 |
| 7,652,252 B1 | 1/2010 | Rajavel et al. | |
| 7,687,871 B2 | 3/2010 | Maimon | |
| 7,737,411 B2 | 6/2010 | Gunapala et al. | |
| 7,755,023 B1 | 7/2010 | Rajavel et al. | |
| 7,800,067 B1 | 9/2010 | Rajavel et al. | |
| 8,237,228 B2 | 8/2012 | Or-Bach et al. | |

(Continued)

OTHER PUBLICATIONS

Dreiske, Peter D., "Development of Two-Color Focal-Plane Arrays Based on HDVIP", Infrared Technology and Applications XXXI, 2005, pp. 325-330, vol. 5783, SPIE, Bellingham, WA.

(Continued)

*Primary Examiner* — Eric A. Ward

(74) *Attorney, Agent, or Firm* — Lewis Roca Rothgerber Christie, LLP

(57) ABSTRACT

A detector. The detector includes a first collector, a first interface layer on the first collector, a first absorber on the first interface layer, a second interface layer on the first absorber, and a second collector on the second interface layer. The first absorber is configured to absorb photons to generate electron-hole pairs. The first interface layer may include a barrier configured to impede the flow of majority carriers from the first absorber to the first collector. The second barrier may include a barrier configured to impede the flow of majority carriers from the first absorber, or from a second absorber, to the second collector.

32 Claims, 12 Drawing Sheets

(56) References Cited

U.S. PATENT DOCUMENTS

| | | | |
|---|---|---|---|
| 8,450,773 | B1 | 5/2013 | Kim et al. |
| 8,928,029 | B2 * | 1/2015 | Ting ................. H01L 31/02016 257/107 |
| 9,024,296 | B2 * | 5/2015 | Sundaram ........... H01L 27/1463 257/21 |
| 9,146,157 | B1 | 9/2015 | Rajavel et al. |
| 9,337,124 | B1 | 5/2016 | Herrault et al. |
| 9,799,785 | B1 * | 10/2017 | Ting ................ H01L 31/035236 |
| 2007/0215900 | A1 | 9/2007 | Maimon |
| 2008/0111152 | A1 | 5/2008 | Scott et al. |
| 2011/0147877 | A1 * | 6/2011 | Wehner ............... H01L 27/1446 257/446 |
| 2016/0087001 | A1 * | 3/2016 | Tennant ............ H01L 27/14669 257/440 |
| 2016/0290865 | A1 * | 10/2016 | Delaunay ............ H01L 31/0304 |

OTHER PUBLICATIONS

Hoang, A.M. et al., "Demonstration of high performance bias-selectable dual-band short-/mid- wavelength infrared photodetectors based on type-II InAs/GaSb/AlSb superlattices", Applied Physics Letters, 2013, pp. 011108-1 through 011108-4, vol. 102, American Institute of Physics.

Sharifi, Hasan et al., "Fabrication of High Operating Temperature (HOT), Visible to MWIR, nCBn Photon-Trap Detector Arrays", Infrared Technology and Applications XXXIX, 2013, pp. 87041U-1 through 87041U-6, vol. 8704, SPIE.

Brown, Gail J. et al., "Type-II InAs/GaSb superlattices for very long wavelength infrared detectors", Physica E, 2004, pp. 471-474.

Martyniuk, P. et al., "New concepts in infrared photodetector designs", Applied Physics Reviews, Journal of Applied Physics, Nov. 13, 2014, pp. 041102-1 through 041102-35, vol. 1.

Martyniuk, P. et al., "Barrier infrared detectors", Opto-Electronics Review, 2014, pp. 127-146, vol. 22, No. 2.

Smith, D. L. et al., "Proposal for strained type II superlattice infrared detectors", Journal of Applied Physics, Sep. 15, 1987, pp. 2545-2548, vol. 62, No. 6.

U.S. Office action dated Feb. 10, 2017, for cross reference U.S. Appl. No. 15/136,835, (7 pages).

U.S. Office action dated Oct. 12, 2017, for cross reference U.S. Appl. No. 15/226,787, (13 pages).

Radisic et al., "220-GHz Solid-State Power Amplifier Modules," IEEE Journal of Solid-State Circuits, 47(10): 2291-2297, Oct. 2012.

Samoska, "An Overview of Solid-State Integrated Circuit Amplifiers in the Submillimeter-Wave and THz Regime," IEEE Transactions on Terahertz Science and Technology, 1(1): 9-24, Sep. 2011.

U.S. Office Action dated May 30, 2018, for U.S. Appl. No. 15/226,787, 28 pages.

Biefeld, R. M. et al., "Multistage Infrared Emitters Based on InAsSb Strained Layers Grown by Metal Organic Chemical Vapor Deposition", 1998 Conference on Optoelectronic and Microelectronic Materials and Devices, Dec. 14-16, 1998, 9 pages, IEEE.

Boucenna, M. et al., "Energy gaps and lattice dynamic properties of $InAs_xSb_{1-x}$", Materials Science and Engineering B, 2007, pp. 228-234, Elsevier B.V.

Lockhart, Patric et al., "Terahertz emission mechanisms in $InAs_xP_{1-x}$", Applied Physics Letters, 2008, pp. 011102-1 through 011102-3, vol. 92, American Institute of Physics.

U.S. Office Action dated Feb. 26, 2019, for cross-reference U.S. Appl. No. 15/226,787, 15 pages.

* cited by examiner

HIGH PERFORMANCE OR WAVELENGTH CONFIGURABLE DETECTOR

CROSS-REFERENCE TO RELATED APPLICATION(S)

The present application claims priority to and the benefit of U.S. Provisional Application No. 62/204,124 filed Aug. 12, 2015, titled "HIGH PERFORMANCE/WAVELENGTH CONFIGURABILITY IN IR DETECTOR", the entire content of which is incorporated herein by reference.

FIELD

One or more aspects of embodiments according to the present invention relate to detectors, and more particularly to a detector with high quantum efficiency or alternatively configured to be capable of detecting incident electromagnetic radiation in two wavelength bands.

BACKGROUND

Dual-band capability in an infrared (IR) detector may have various sensing applications and may be constructed using a dual-band detector operated with a dual-polarity read-out integrated circuit (ROIC), or by using a single polarity ROIC and by implementing barriers and the selective depletion of the absorber. For example, such a system may require the selective depletion of a graded absorber to obtain a given voltage dependent spectral response. However, the application of a large reverse bias employed to deplete the absorber may result in increased generation-recombination (G-R) dark current which may diminish the performance of the device. Related art simultaneous mode detectors may operate in a mode in which they detect more than one band, but they may require special ROICs, and the three terminal architecture of the device may not be conducive to scaling to small pitch (small size).

Detectors with high quantum efficiency enhance the sensitivity of the detector. In an infrared (IR) detector, the quantum efficiency may be increased to some extent by increasing the thickness of the absorber layer. This approach however, may achieve only small increases in quantum efficiency for material systems that are limited by the minority carrier diffusion length. In some cases, increasing the thickness of the absorber can result in a decrease in the quantum efficiency (QE), for example if the minority carriers generated away from the junction cannot diffuse across the entire thickness of the absorber to the p-n junction or the collection area.

Thus, there is a need for a dual-band IR detector that provides high quantum efficiency in a material system limited by the minority carrier diffusion length.

SUMMARY

According to an embodiment of the present invention there is provided a detector including: a first collector; a first interface layer, on the first collector; a first absorber, on the first interface layer; a second interface layer, on the first absorber; and a second collector, on the second interface layer, the first absorber being configured to absorb photons.

In one embodiment, the first interface layer includes: a barrier configured to block the flow of majority carriers from the first absorber to the first collector; or a p-n heterojunction; or a p-n homojunction, and the second interface layer includes, a barrier configured to block the flow of majority carriers from the first absorber to the second collector; or a p-n heterojunction; or a p-n homojunction.

In one embodiment, the detector includes, as a major component, a III-V semiconductor, a II-VI semiconductor, or a group IV semiconductor.

In one embodiment, the first absorber includes, as a major component, InAlSb alloy or InAsSb alloy or AlInAsSb alloy.

In one embodiment, the first absorber includes a structure selected from the group consisting of InAs/InAsSb superlattices, InAs/GaSb superlattices, InAs/GaInSb superlattices, InAs/GaSb/AlSb superlattices, and combinations thereof.

In one embodiment, the first absorber includes, as a major component, an n-type semiconductor or a p-type semiconductor.

In one embodiment, the first absorber has a uniform composition.

In one embodiment, the first absorber has a graded composition and a bandgap of the first absorber is: wider in a first region of the first absorber, and narrower in: a second region between the first region and the first interface layer, and a third region between the first region and the second interface layer.

In one embodiment, the first absorber has a linearly graded composition.

In one embodiment, the first absorber has a step-graded composition.

In one embodiment, the detector includes a metal contact penetrating, and electrically isolated from: the second interface layer, and the second collector, and electrically connected to the first absorber.

In one embodiment, the detector is configured to enable the collection, of minority carriers generated in the absorber, at the first collector and the second collector.

In one embodiment, the detector includes: a metal grid contact on the second collector, the metal grid contact being electrically connected to the second collector and to the first collector.

In one embodiment, the detector includes an array common layer on the first collector.

In one embodiment, the detector includes: a metal grid contact on the second collector and electrically connected to the second collector; and an array common layer on the first collector, wherein the metal contact is electrically connected to the array common layer.

In one embodiment, an array detector includes a plurality of pixels each including the detector, the pixels being separated by a plurality of trenches extending through the second collector, through the first interface layer, and through all intervening layers between the second collector, and the first interface layer.

In one embodiment, the detector includes, between the first absorber and the second interface layer: a cross talk prevention barrier on the first absorber; and a second absorber on the cross talk prevention barrier, wherein: the first absorber includes, as a major component, an n-type semiconductor or a p-type semiconductor, the second absorber includes, as a major component, an n-type semiconductor or a p-type semiconductor, and the second absorber has a smaller bandgap than the first absorber.

In one embodiment, the detector includes a metal contact penetrating, and electrically isolated from: the second interface layer, and the second collector, and electrically connected to the second absorber.

In one embodiment, the first interface layer forms a first energy barrier configured to impede the flow of minority carriers from the first absorber to the first collector in the absence of a bias, and to enable the flow of minority carriers from the first absorber to the first collector upon the application of a first bias to the detector.

In one embodiment, the second interface layer forms a second energy barrier configured to impede the flow of minority carriers from the second absorber to the second collector in the absence of a bias, and to enable the flow of minority carriers from the second absorber to the second collector upon the application of a second bias to the detector.

In one embodiment, the first interface layer is a first barrier layer, configured, by selection of: a thickness of the first barrier layer, and a doping level of the first barrier layer, to enable the flow of minority carriers from the first absorber to the first collector upon the application of a first bias to the detector.

In one embodiment, the second interface layer is a second barrier layer configured by selection of: a thickness of the second barrier layer, and a doping level of the second barrier layer, to enable the flow of minority carriers from the second absorber to the second collector upon the application of a second bias to the detector.

In one embodiment, the magnitude of the first bias is larger than the magnitude of the second bias.

In one embodiment, the magnitude of the second bias is between 10 mV and 200 mV.

In one embodiment, the detector is configured: to collect minority carriers from only the second absorber when a bias having a magnitude greater than the magnitude of the second bias and less than the magnitude of the first bias is applied to the detector, and to collect minority carrier from the first absorber and from the second absorber when a bias with a magnitude greater than the magnitude of the first bias is applied to the detector.

In one embodiment, the magnitude of the first bias is smaller than the magnitude of the second bias.

In one embodiment, the magnitude of the first bias is between 10 mV and 200 mV.

In one embodiment, the detector is configured: to collect minority carriers from only the first absorber when a bias having a magnitude greater than the magnitude of the first bias and less than the magnitude of the second bias is applied to the detector, and to collect minority carrier from the first absorber and from the second absorber when a bias with a magnitude greater than the magnitude of the second bias is applied to the detector.

In one embodiment, an array detector includes a plurality of pixels each including the detector, the pixels being separated by a plurality of trenches extending through the second collector, through the first interface layer, and through all intervening layers between the second collector, and the first interface layer.

According to an embodiment of the present invention there is provided a method of forming a detector, the method including: forming a first collector; forming a first interface layer on the first collector; forming a first absorber on the first interface layer; forming a second interface layer on the first absorber; and forming a second collector on the second interface layer; the first absorber being configured to absorb photons.

In one embodiment, the first interface layer includes: a barrier configured to impede the flow of majority carriers from the first absorber to the first collector; or a p-n heterojunction; or a p-n homojunction, and the second interface layer includes: a barrier configured to impede the flow of majority carriers from the first absorber to the first collector; or a p-n heterojunction; or a p-n homojunction.

According to an embodiment of the present invention there is provided a method of operating a detector, the detector including: a first collector; a first interface layer, on the first collector; a first absorber, on the first interface layer; a second interface layer, on the first absorber; a second collector, on the second interface layer; a metal contact penetrating, and electrically isolated from, the second interface layer and the second collector; the method including: absorbing, via the first absorber, photons; enabling the flow of minority carriers from the first absorber to the first collector; and enabling the flow of minority carriers from the first absorber to the second collector.

BRIEF DESCRIPTION OF THE DRAWINGS

These and other features and advantages of the present invention will be appreciated and understood with reference to the specification, claims, and appended drawings wherein:

DETAILED DESCRIPTION

Figure 1:
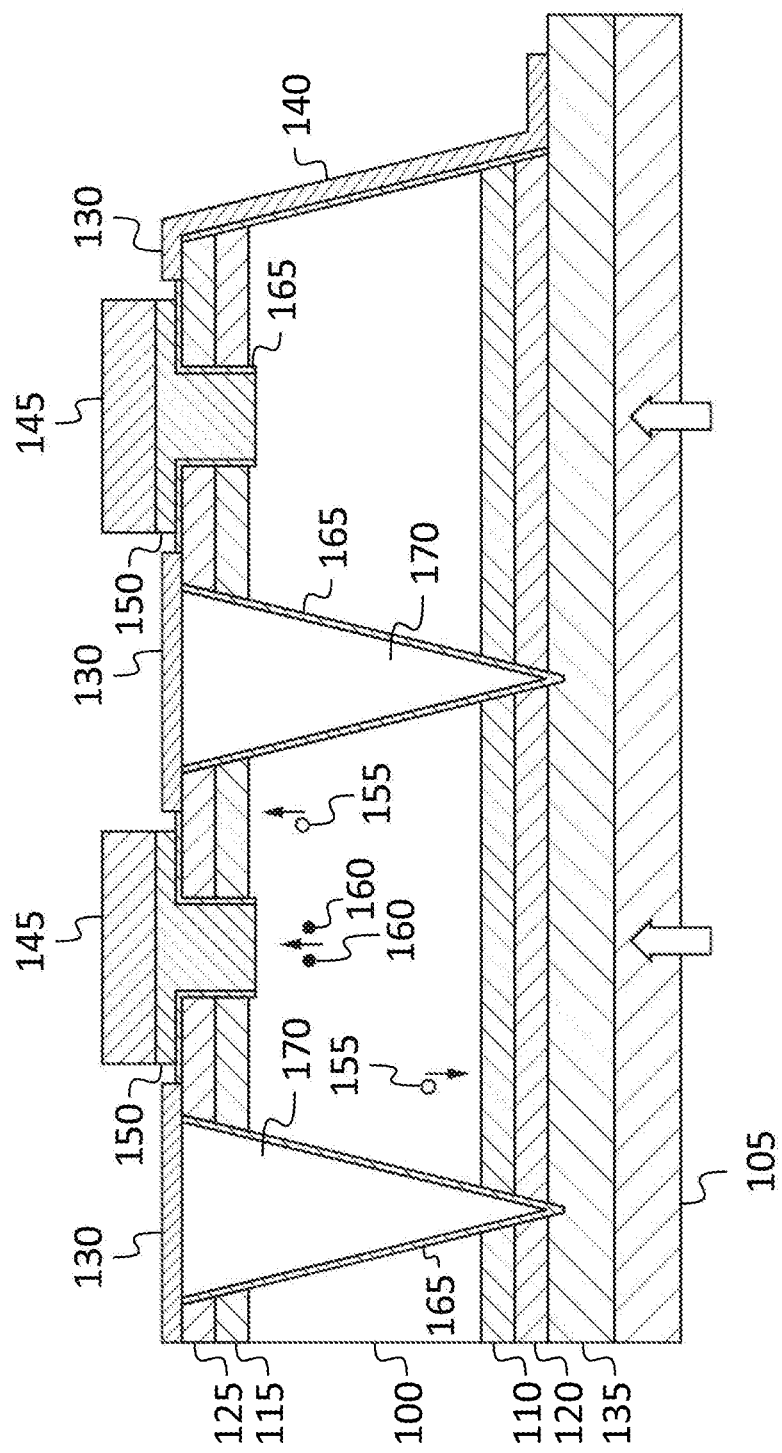
FIG. 1 is a schematic cross-sectional view of a high quantum efficiency detector, according to an embodiment of the present invention.

The detailed description set forth below in connection with the appended drawings is intended as a description of exemplary embodiments of a high quantum efficiency performance detector, or a wavelength configurable IR detector provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

While III-V semiconductors offer scalability, cost and manufacturability advantage, the relative short diffusion length of the minority carriers may be an obstacle to realizing high (>90% external) quantum efficiency (QE). As such the QE for antimony-based devices may be 20-70% (depending on the wavelength band), well short of 90%.

A detector according to some embodiments enhances the performance of III-V based infrared (IR) detectors operating in the visible (VIS) to very long wavelength infrared (VL-WIR ~20 μm) wavelengths. Embodiments of the present invention may enable enhancement of the QE performance of antimony-based detectors (e.g., antimony-based long-wavelength infrared (LWIR) detectors) to >75%.

In an alternate embodiment, the detector incorporates detection wavelength adjustability, through the addition of a second wavelength band, providing the capability to detect either Band 1 or (Band 1+Band 2), where Band 1 is the "blue" (shorter wavelength) band and band 2 is the "red" band; red and blue are indicative of the relative wavelength separation of the two bands. This feature may be accomplished by increasing the magnitude of the detector bias, without the need for a dual-polarity ROIC. In one embodiment, in the MWIR band, Band 1 may be 3.0 to 4.3 μm and Band 2 may span the 4.3 to 5.0+μm band. A sensing application that is looking for a bright signature may then sense in Band 1 and operate at an elevated temperature (e.g. >150K) and when the circumstances dictate, re-configure the detector by increasing the operating bias of the detector to sense over the entire 3.0 to 5.0+ band (i.e., in Band 1+Band 2), and concurrently reduce the operating temperature (e.g. to 120K) only when needed, thereby conserving cooler life and power needed to operate the sensor.

Under visually degraded environments (obscurants/dust/fog/blizzard conditions), the ability to rapidly switch between Band 1 or (Band 1+Band 2) may make it possible to get the maximum focal plane array (FPA) performance as this depends on the IR phenomenology related to the precipitation, humidity, particle size, type and density.

Embodiments of the present invention may be used with various material systems. For example, embodiments of the present invention may be used in antimony-based devices, which may have low minority carrier mobility and lifetime, or in other detectors such as InAsSb in applications in which QE degradation upon irradiation may be reduced. Other examples include mercury, lead-based or silicon-based detectors that can be operated in the VIS-VLWIR spectrum.

Referring to FIG. 1, in one embodiment, a detector is fabricated on a substrate 105 and light is incident on the substrate side of the detector. In this embodiment, the detector includes one absorber 100. The first interface layer 110, which may be a barrier layer, or may include a p-n heterojunction or a p-n homojunction, and second interface layer 115 which also may be a barrier layer, or may include a p-n heterojunction, or a p-n homojunction, enable collection of the photo-generated carriers from both sides of the same absorber 100. The interface layer 110 may be include, for example, as a major component AlSb, AlAsSb or alloys such as AlGaSb and related alloys, and it may be doped or undoped. In such an embodiment, the minority carriers may diffuse (or diffuse assisted by drift) in opposite directions to facilitate the efficient collection from either side of the absorber 100. The first collector layer 120 and second collector layer 125 may serve to collect the minority carriers, and facilitate the deposition of metal contact layers which are electrically connected to, and route the carriers to, the common ground. A contact metal layer including a metal grid 130 serves to interconnect the individual pixels and serves as the common interconnect layer for the array and is associated with the top contact. The metal grid 130 is connected to the array common layer 135 at the bottom, through the metallization 140 deposited near the periphery of the array. In this manner the metal grid 130 is electrically connected to the second collector and to the first collector. The unit cells of the read-out integrated circuit (ROIC) are connected to the absorber layer 100 within each pixel through indium bumps 145 that are deposited on metal contacts 150 which are electrically isolated, but physically located above the second collector layer 125. In one embodiment of the interface layer 110, 115, the interface layer thickness and band offsets are designed to be the same for the respective junctions formed by (e.g., at the boundary between) the absorber 100 and the first interface layer 110 and by the absorber 100 and the second interface layer 115. For clarity, cross-hatching has been omitted from some elements of FIG. 1. The absorber 100 may include, as a major component, an n-type or a p-type semiconductor, e.g., n-doped or p-doped InAlSb or InAsSb or AlInAsSb alloy, alternatively the absorber 100 can be an undoped semiconductor, and/or it may include a structure such as an InAs/InAsSb superlattice, an InAs/GaSb superlattice, an InAs/GaInSb superlattice, an InAs/GaSb/AlSb superlattice or a combination of such structures.

For example, in one embodiment the device may operate as an InAs/InAsSb VLWIR detector with enhanced QE performance. In a related art superlattice (SL) detector, the low (<10 cm$^2$/Vs) hole mobility in the vertical direction, (with a diffusion length of about 3 to 4 μm), may cause any increase in the absorber thickness beyond the diffusion length to be counterproductive, and may cause the QE to be limited to approximately 20% (about 20%).

For VLWIR radiation to be absorbed efficiently, the superlattice absorber thickness may be made to be thick, e.g., about 8 μm. By virtue of the double junction of the embodiment of FIG. 1, the total thickness of the absorber 100 can be ~2× the diffusion length and yet collect the entire photo-generated carrier population before the carriers undergo recombination.

As shown in FIG. 1, holes 155 that are collected near the incidence surface of IR radiation as well as those collected near the top of the mesa can diffuse to the nearest collector layer and produce photocurrent. A sea of majority carriers (electrons 160) results in the ready collection of the electrons though the metal contact/indium bump. The schematic shows an n-type absorber 100 (with holes as the minority carrier). In some embodiments, analogous detectors use a p-type absorber 100 instead. The device may include one or more insulating layers 165 and planarization fill 170. The two interface layers 110, 115 are designed to block electrons (majority carriers) when n-type absorbers are used. Likewise, the interface layers 110, 115 are designed such that the holes (majority carriers) are blocked when p-type absorbers are used. The interface layers 110, 115 may include p-n heterojuctions and p-n homojunctions.

Figure 2:
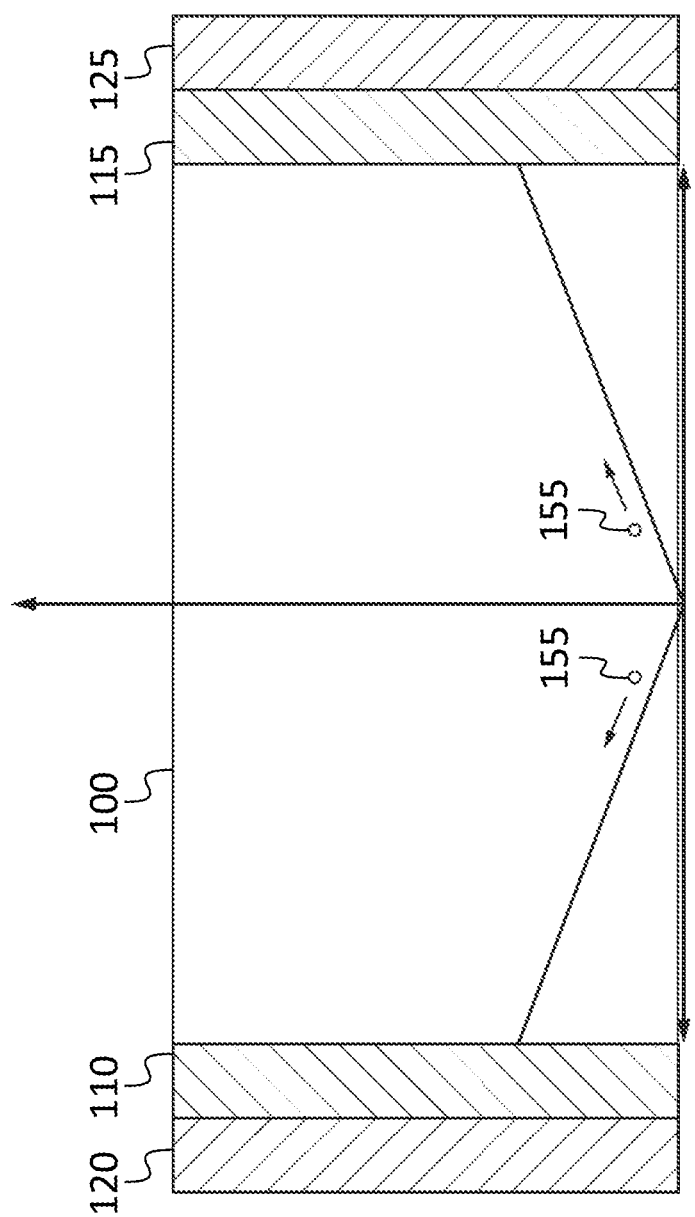
FIG. 2 is a schematic cross-sectional view of a high quantum efficiency detector with a graded absorber, according to an embodiment of the present invention.

In another embodiment, the composition of the absorber 100 may be graded as illustrated in FIG. 2. For example, in a mid-wavelength infrared (MWIR) absorber the level of grading can range from 10 to 100 meV/micron of absorber thickness. The narrower bandgap regions of the absorber 100 are close to the collector regions and the wider bandgap portion is towards the inside (middle) of the absorber. Grading of the absorber in this manner introduces a built-in electric field that serves to drive the minority carries toward one of the collectors 120, 125. The grading of the absorber 100 may be symmetric or asymmetric about the center of the absorber. The absorber 100 may be linearly graded or step graded. In one embodiment, only a portion of the absorber 100 is graded. In some embodiments the graded regions are of unequal thicknesses.

The embodiment illustrated in FIG. 1 incorporates two interface layers 110, 115, each forming one or more barriers to block majority carriers while enabling the transport and collection of minority carriers. Each interface layer 110, 115 may form a barrier at a boundary with another layer (e.g., with an absorber layer 100) and/or it may form a barrier internally, e.g., if it includes a p-n heterojunction or a p-n homojunction. For example, the interface layer 110, 115 may be a graded semiconductor whose bandgap is larger than that of the absorber 100 and that forms a p-n junction at the boundary between the interface layer 110, 115 and the absorber 100. Alternatively, the interface layer 110, 115 may include a p-n homojunction or a p-n heterojunction. The composition of the collector layer may be similar to that of a portion of the interface layer 110, 115.

Figures 3A, 3B:
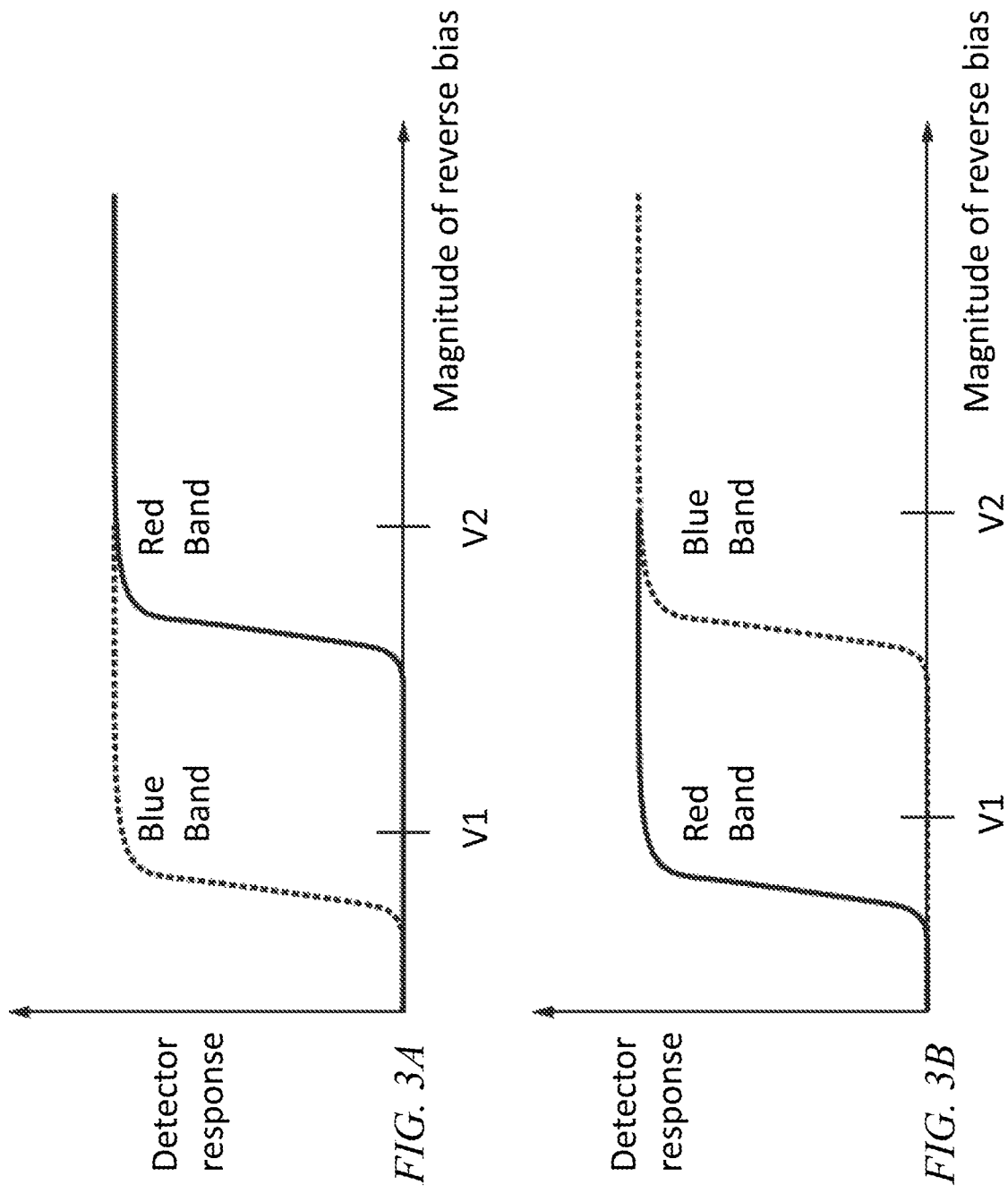
FIG. 3A is a schematic graph of detector response, according to an embodiment of the present invention.
FIG. 3B is a schematic graph of detector response, according to another embodiment of the present invention.
Figure 4:
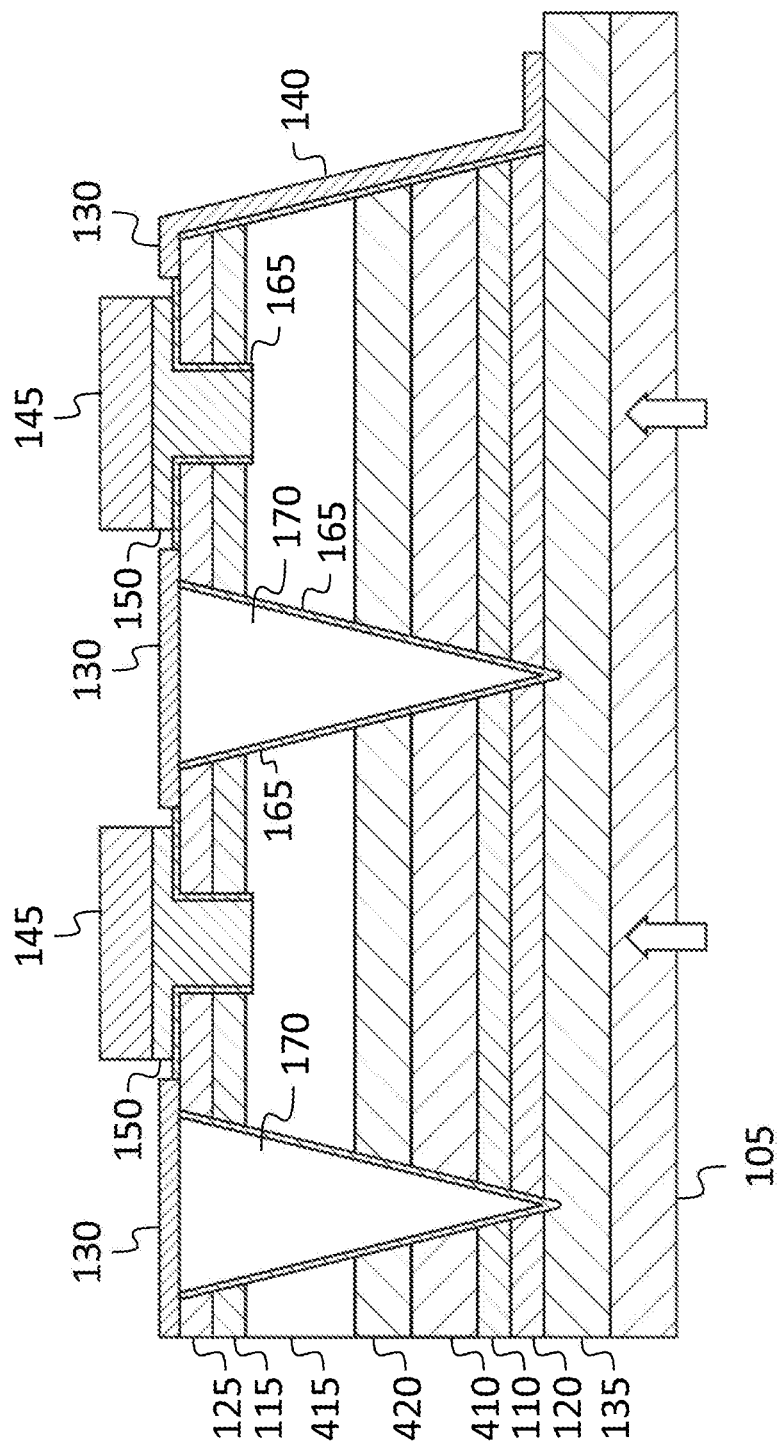
FIG. 4 is a schematic cross-sectional view of a dual-band detector, according to an embodiment of the present invention.

Referring to FIGS. 3A, 3B, and 4, in another embodiment, in which the absorber 100 of FIG. 1 is replaced with a first absorber 410 and a second absorber 415 separated by a minority carrier barrier layer (or "cross talk prevention interface layer") 420, the device may operate as a detector with dual-band functionality. Upon the application of a small or near-zero reverse bias V1 the detector can sense the primary band. Following the application of a larger magnitude of reverse bias V2, the detector senses the primary and the secondary bands (simultaneously), as illustrated in FIGS. 3A and 3B. Depending on the design (e.g., the respective bandgaps of the first absorber 410 and the second absorber 415), the cutoff wavelength of the primary band (e.g., the band which is active when the detector is operated in a single-band mode) which is activated at the smaller reverse bias may be either less than or more than that of the secondary band. In the illustration in FIG. 3, the cutoff wavelength of the red band is longer than that of the blue band.

The designs of the first absorber 410 and first interface layer 110 and the second absorber 415 and second interface layer 115 are chosen such that voltage dependent spectral response is achieved, as illustrated in FIGS. 3A and 3B. The blue band may be chosen as the primary band (FIG. 3A), wherein the blue band response is obtained upon the application of a small reverse bias, and the detector may be configured to simultaneously detect the red band signal through the application of a larger value of reverse bias to the detector. Alternatively, the red band may be chosen as the primary band (FIG. 3B), wherein the red band response is obtained upon the application of a small reverse bias, and the detector may be configured to concurrently (e.g., simultaneously) detect the blue band signal through the application of a larger value of reverse bias to the detector.

Referring to FIG. 4, in one embodiment light enters though the substrate and the shorter wavelength light (or "blue band" light, or "Band 1" light) is absorbed in the first absorber 410, and the longer wavelength light (or "red band" light, or "Band 2" light) is absorbed in the second absorber 415. The combination of the first absorber 410, the first interface layer 110 and the first collector 120 forms a first diode, and the combination of the second absorber 415, the second interface layer 115 and the second collector 125 forms a second diode. These junctions are capable of detecting Band 1 radiation (determined by the composition of the first absorber 410) and Band 2 radiation (determined by the composition of the second absorber 415), respectively. The cross talk prevention interface layer 420 may be used to prevent the minority carriers generated in Band 1 from diffusing to Band 2 (e.g., it prevents the minority carriers generated in the first absorber 410 from diffusing to the second junction) and vice-versa. The cross talk prevention interface layer 420 allows, however, for the transport of the majority carriers, which are collected through the indium bump metal contact illustrated in FIG. 4. Each of the first and second interface layers 110, 115 forms a barrier that blocks majority carriers, or a type of a heterojunction at a boundary with another layer, e.g., with an absorber layer; as such the interface layer design may be replaced with heterojunction design with a similar functionality, i.e., to minimize depletion in the absorber while promoting the facile transport of minority carriers.

Figure 5A:
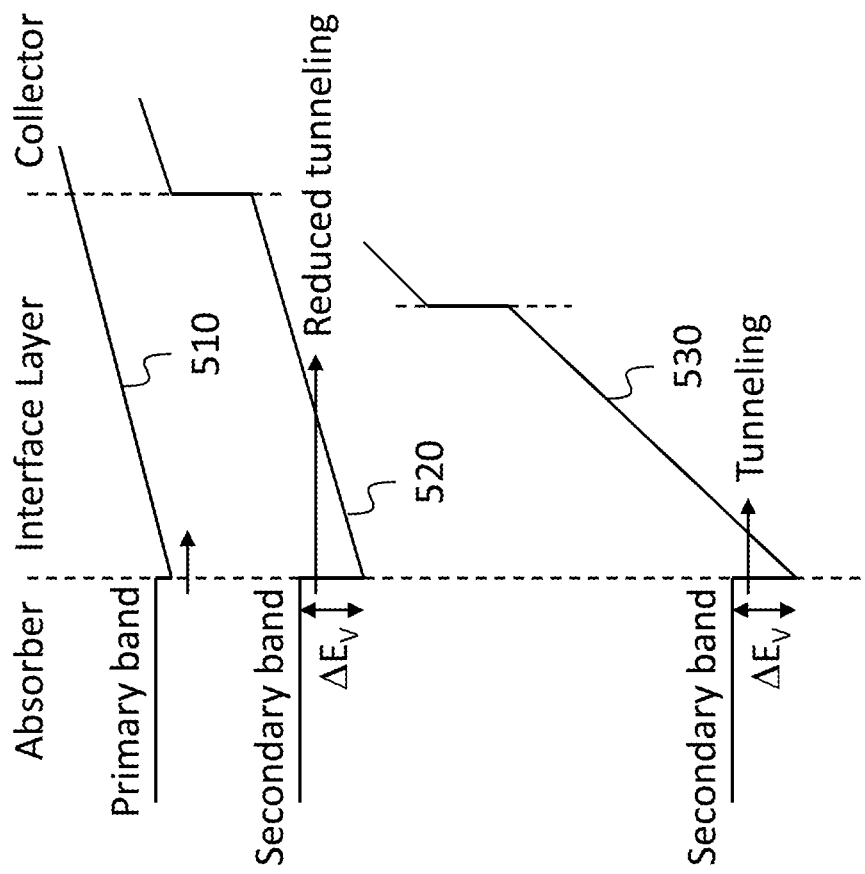
FIG. 5A is a graph showing three valence band energy diagrams, according to an embodiment of the present invention.

The selective turn-on of one band over the other is achieved by designing the absorber and interface layers such that the primary band turns on at zero or near-zero bias. The secondary band is activated upon the application of a larger value of reverse bias which results in band bending of the associated interface layer 110, 115, resulting in the tunneling of carriers, as illustrated in FIG. 5A. The thickness of the interface layer 110, 115, the absorber/interface layer valence band offset (for the case of n-type absorbers) and the doping level in the interface layer 110, 115 are the design parameters that determine the bias required to activate the secondary band.

For example, the valence band energy diagrams of FIG. 5A show (i) in a first curve 510, the valence band energy across the second interface layer 115 (corresponding to the primary band) for a small reverse bias, (ii) in a second curve 520, the valence band energy across the first barrier 110 (corresponding to the secondary band) for a small reverse bias, and (iii) in a third curve 530, the valence band energy across the first barrier 110 (corresponding to the secondary band) for a large reverse bias. The horizontal axis for the first curve 510 corresponds to position in the upwards direction in FIG. 4, and the horizontal axis for the second curve 520 corresponds to position in the downwards direction in FIG. 4. Referring to the first curve 510, the hole barrier is small across the second interface layer 110, allowing the facile collection of holes in the primary band at zero or near-zero reverse bias. For the same small reverse bias, because of the larger hole barrier (represented by $\Delta E_V$) at the first interface layer 110, tunneling is reduced, and there is minimal or negligible collection of holes from the first absorber 410. Thus, when a small reverse bias is used, only the primary band is turned on. When a large reverse bias is applied, holes tunnel more readily from the first absorber 410 into the first interface layer 110, so that with a large reverse bias, holes are collected from both the first absorber 410 and the second absorber 415, i.e., both the primary band and the secondary band are turned on. In one embodiment the first interface layer 110 and the second interface layer 115 are each about 1000 to 3000 Angstroms thick.

Due to the band alignments in a dual band device, the reverse bias turn-on voltage for the red band may be larger than that for the blue band. In embodiments of the present invention, the turn-on voltage for the blue and red bands may be independently optimized (adjusted).

In one embodiment, the doping level in the first interface layer 110 (e.g., corresponding to the secondary band) is such that upon the application of a large reverse bias, the bulk of the electric field falls across the first interface layer 110 which may be doped at a lower level when compared to the second interface layer 115; and the second interface layer 115 (e.g., corresponding to the primary band) is doped, accordingly, at a higher level compared to the first interface layer 110. Additionally, in some embodiments the doping level of the second absorber 415 (e.g., the absorber of the primary band) is increased (e.g., with homogeneous doping or spike doping in the vicinity of the absorber/interface layer interface) to reduce or minimize depletion of the second absorber 415 when a large reverse bias is applied to the detector to turn on the secondary band.

When n-type absorbers are used, the interface layer 110, 115 is used to block the electrons (majority carriers), and the valence band offset ($\Delta E_v$) between the absorber and the interface layer 110, 115 is designed to enable transport of holes (minority carriers) at near-zero bias or the application of a reverse bias. When p-type absorbers are used, the interface layer 110, 115 is used to block the holes (majority carriers), and the conduction band offset ($\Delta E_c$) between the absorber and the interface layer 110, 115 is designed to enable transport of electrons (minority carriers) at either near-zero bias or the application of a reverse bias. The illustrations depict the use of n-type absorbers (hole minority carriers); one of skill in the art will understand that analogous embodiments may be constructed with p-type absorbers. The minority carrier barrier is referred to herein as an "energy barrier". Accordingly, the hole barrier $\Delta E_v$, which is the barrier to minority carriers in a device with an n-type absorber, is referred to herein as an "energy barrier". Similarly, in a device with a p-type absorber, the electron (i.e., minority carrier) barrier $\Delta E_c$ is also referred to herein as an "energy barrier".

Figure 5B:
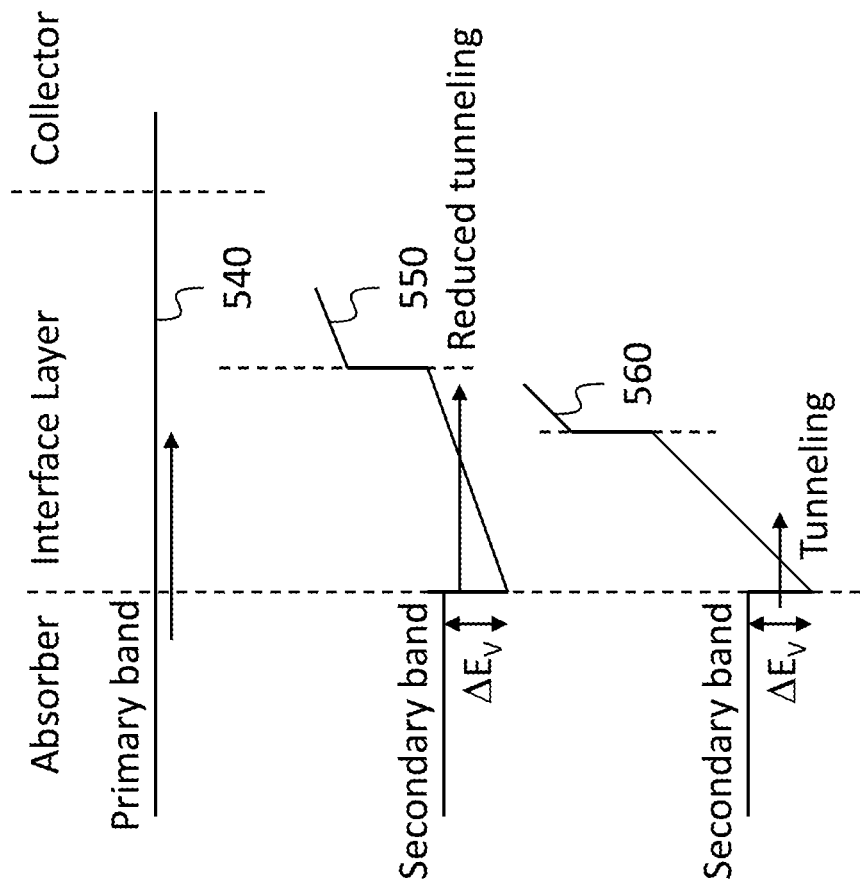
FIG. 5B is a graph showing three valence band energy diagrams, according to another embodiment of the present invention.

Referring to the first and second curves 540, 550 of FIG. 5B, in one embodiment the thickness of the first interface layer 110 (for the secondary band) is smaller than the thickness of the second interface layer 115, and a near-zero reverse bias is sufficient to obtain a response from the primary band. For this near-zero reverse bias, the barrier $\Delta E_V$ impedes transport of holes across the interface layer, and the secondary band's response is absent under near-zero bias. Referring to the third curve 560 of FIG. 5B, when a larger reverse bias is applied, bending of the thinner interface layer 110 in the secondary band results in the tunneling of carriers across the triangular potential well. Thus the secondary band's response (in addition to the primary band's response) is obtained under larger reverse bias operating conditions. In one embodiment the first interface layer 110 is 1000 Angstroms thick and the second interface layer 115 is 3000 Angstroms thick.

Example 1

An MWIR detector that includes an absorber and two sets of interface layers and collectors was fabricated. The purpose of the experiment was to validate the functionality of the detector with either junction (i.e. absorber/interface layer/collector) operated either independently or in tandem, to detect infrared light. The results validate the feasibility and operation of the device with junctions on either side of the absorber. Depending on the specifics of the absorber design the device can be operated as a high quantum efficiency device (FIG. 1), or alternatively, designed to operate at a dual-band detector (FIG. 4). Furthermore, the detector may be constructed using a thick absorber (absorber thickness ~2× (about 2×) the diffusion length of minority carriers), either with or without grading to achieve high QE performance. Alternatively, the detector may include two different absorbers with different bandgaps to achieve dual-band functionality.

Figure 6:
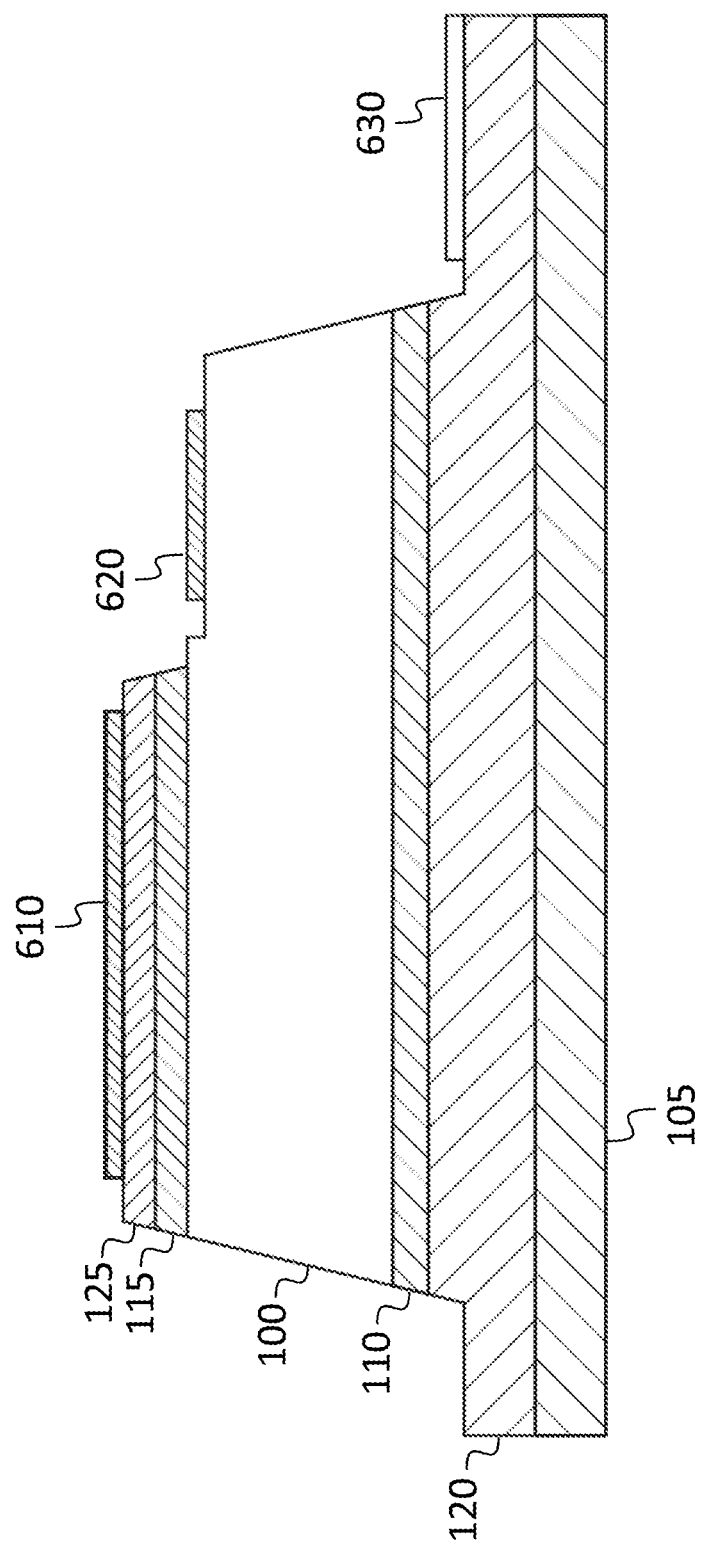
FIG. 6 is a schematic cross-sectional view of an exemplary detector, according to an embodiment of the present invention.

A schematic of the device that was built to validate double junction functionality is illustrated in FIG. 6. The device has a top contact 610, an absorber contact 620, and a bottom contact 630. The device in FIG. 6 was designed and fabricated for ease of fabrication and concept validation. Alternative device layouts for the device structure shown in FIG. 1 may be implemented to enhance the fill-factor and performance of the device.

N-type InAsSb alloy with cutoff wavelength in the MWIR was used as the absorber layer. The interface layers were composed substantially of AlSb; the collectors were p-type $InAs_{0.8}Sb_{0.2}$, however, and n-type collectors could also have been used. In some embodiments the collectors may include, as a major component, $InAs_xSb_{1-x}$ with $0.75<X<0.9$. In some embodiments the absorber may include, as a major component, $InAs_xSb_{1-x}$ with $0.75<X<0.9$.

Figure 7:
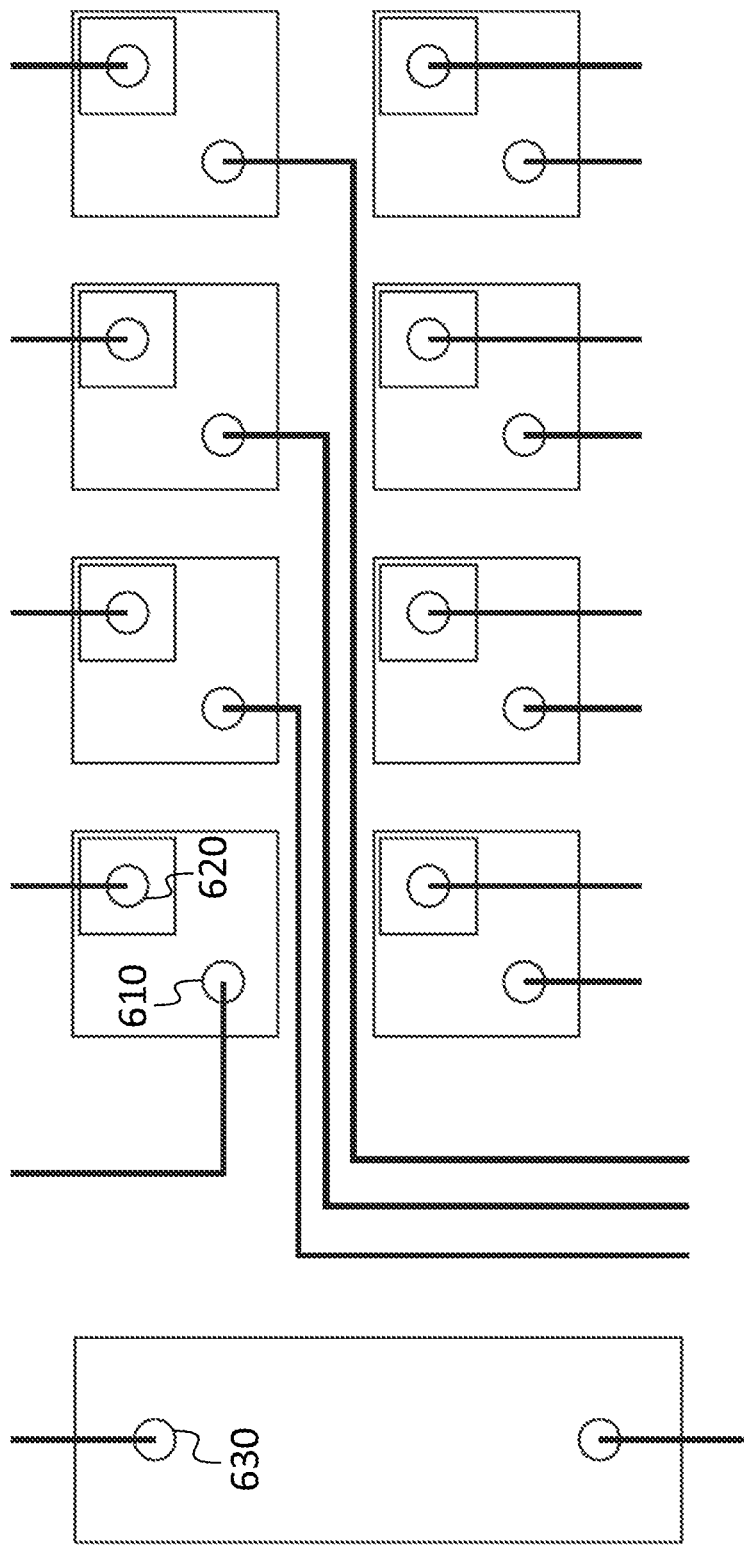
FIG. 7 is a top view of an exemplary detector, according to an embodiment of the present invention.
Figure 8A:
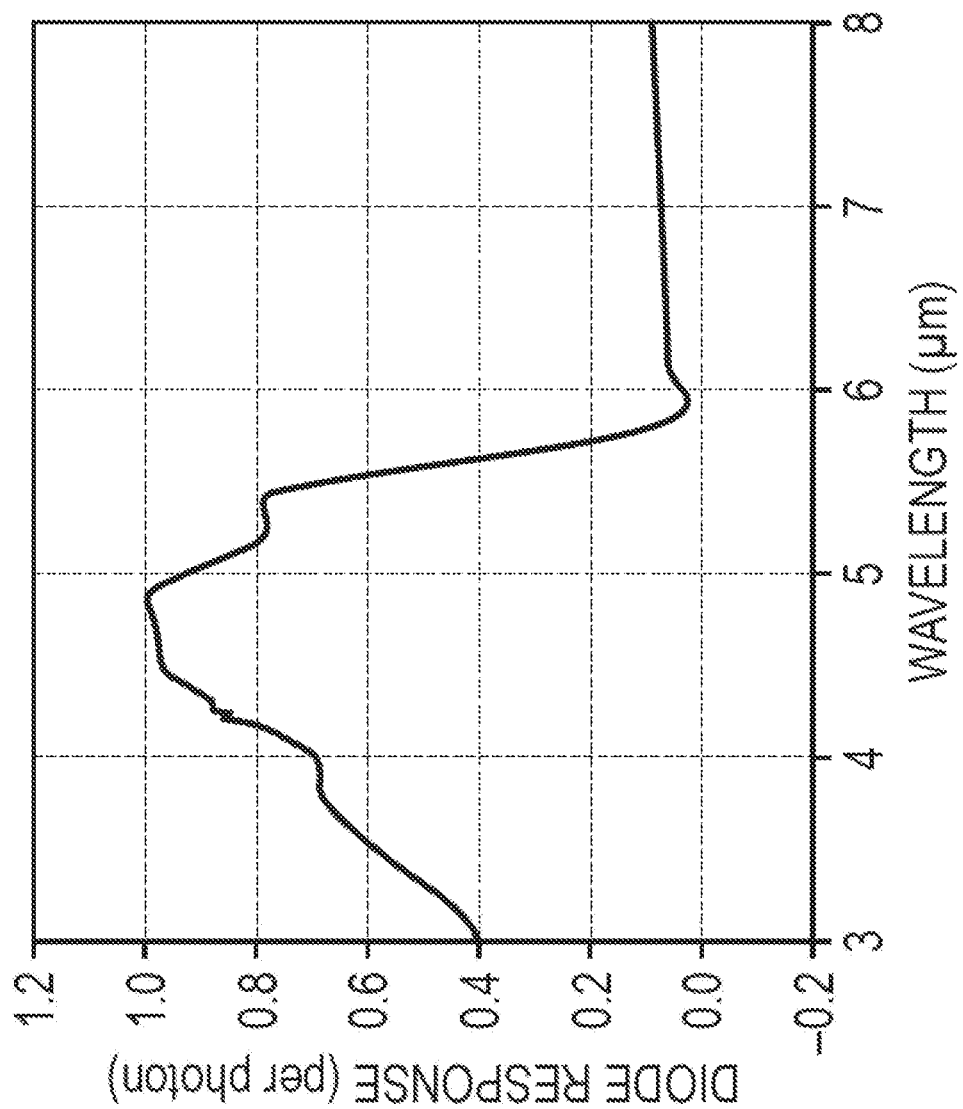
FIG. 8A is a graph of the spectral response of a detector, according to an embodiment of the present invention.
Figure 8B:
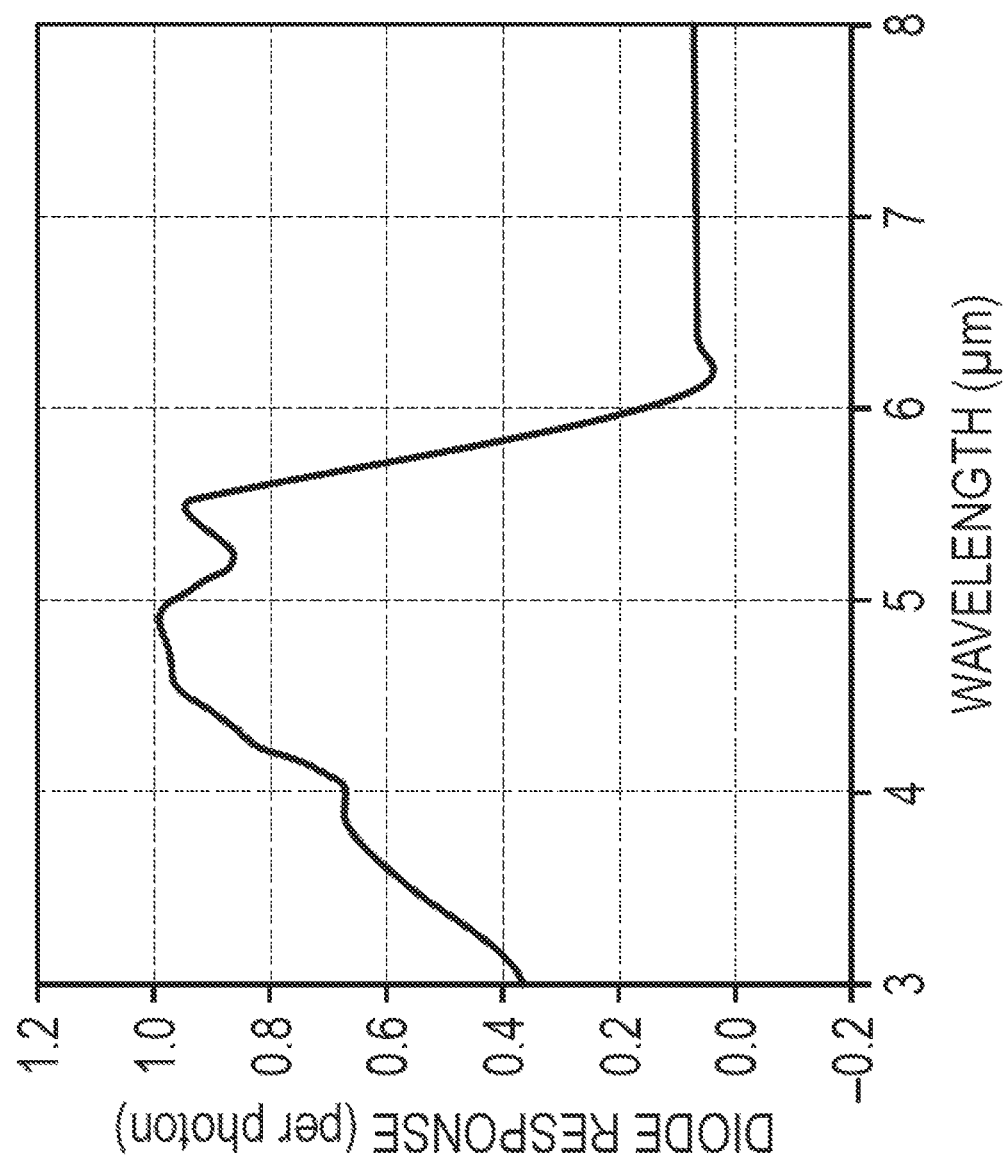
FIG. 8B is a graph of the spectral response of a detector, according to an embodiment of the present invention.

The layout for the individual diodes is illustrated in FIG. 7. FIG. 7 shows a layout of the devices illustrating the top and bottom contacts and the absorber contacts. The dimension of the square detectors was approximately (about) 400 µm. A dry etch process was used to etch the mesa isolated structures. The top and bottom junction designs are nominally the same which may allow for either junction to operate under the same bias. Gold was use as the contact layer, and the three-terminal devices were tested to measure the spectral response, photocurrent collection and I-V characteristics.

The results are shown in FIGS. 8-12. FIG. 8A show the spectral response of the detector, measured using the bottom contact and the absorber contact (FIG. 8A), and measured using the top contact and absorber contact (FIG. 8B). The data are very similar, validating the utility of either junction (top or bottom) or both when operated in tandem to collect the photocurrent, validating the collection of carriers from either side of the absorber, and the operation of the device whose schematic is shown in FIG. 1. The measurements were conducted at 150K.

Figure 9:
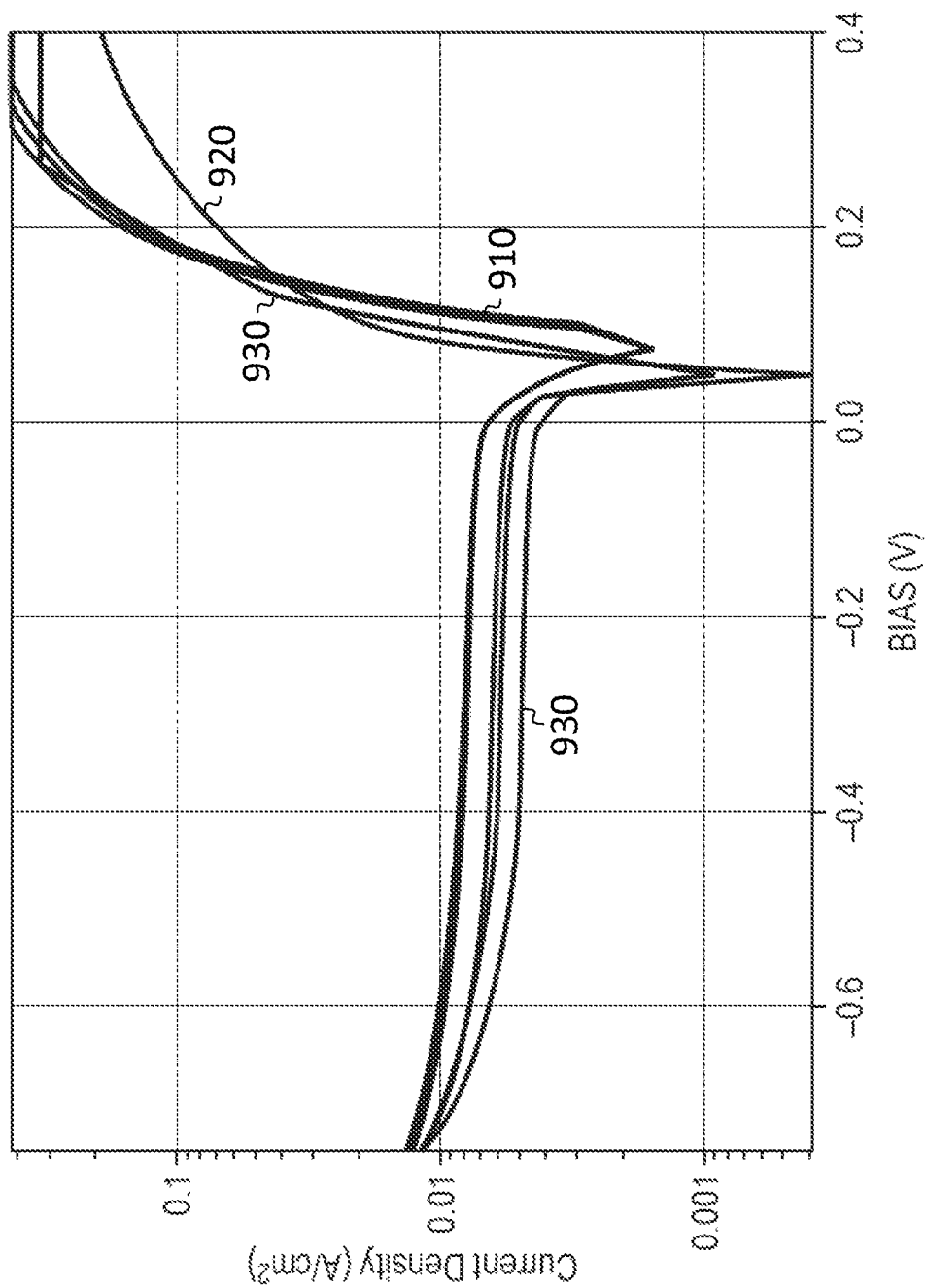
FIG. 9 is a graph of the photocurrent density of a detector, according to an embodiment of the present invention.

FIG. 9 is a graph of the photocurrent density as a function of bias when the detector was illuminated with light from a black body. Results were measured using the top contact (curves 910), bottom contacts (curves 920) and the top and bottom contact connected in tandem (curves 930). Within experimental error (i.e. estimation of the actual area of the device and uniformity of the top vs. bottom junctions), the data are very similar, validating the utility of either junction (top or bottom) operated independently (e.g. for dual band operation), or in tandem (for high quantum efficiency mode), to produce the photocurrent. The tests were conducted at 120K.

Figure 10:
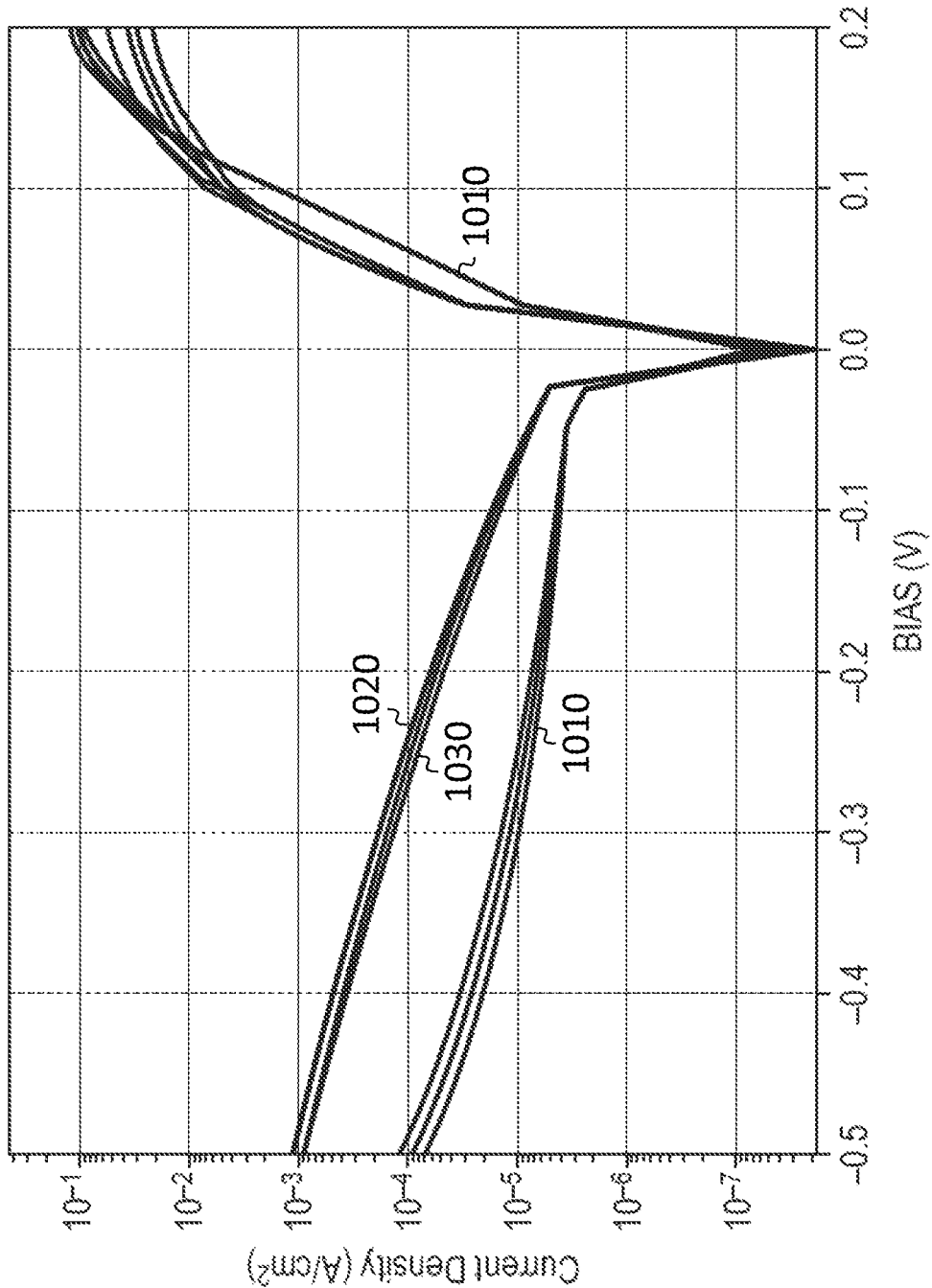
FIG. 10 is a graph of the dark current density of a detector, according to an embodiment of the present invention.

FIG. 10 shows a graph of the dark current density as a function of bias when no light is incident on the detector. Results measured using the top contact (curves 1010), bottom contacts (curves 1020) and the top and bottom contact connected in tandem (curves 1030). Within experimental error (i.e. estimation of the actual area of the device, and uniformity of the top vs. bottom junctions), the data are very similar, validating the operation of either junction (top or bottom) separately, or in tandem. The measurements were conducted at 120K.

The example described here was of a MWIR device which used n-type InAsSb as the absorber layer. Other materials and doping types may be used to achieve high QE or alternatively, dual-band functionality. Likewise the wavelength range may be used cover the VIS to VLWIR electromagnetic spectrum through the use of materials with the appropriate bandgap and suitable interface layers. Examples for absorbers include alloys composed substantially of (e.g., including, as a major component) InAsSb or InAlAsSb, superlattices composed substantially of (e.g., including, as a major component) InAs/GaSb, or InAs/InAsSb or InAs/GaSb/AlSb. Other material systems include alloys consisting substantially of (e.g., including, as a major component) $Hg_{1-x}Cd_xTe$ and PbTe, PbSe, PbSnTe and related alloys. Alternatively, Si based absorbers such as (e.g., including, as a major component) SiGe or SiGeC may also be employed. The dual-band mode of operation may span combinations that span the VIS-VLWIR spectrum such as VIS/SWIR, MWIR1/MWIR2, MWIR/LWIR, LWIR1/LWIR2, VIS/MWIR, etc. While barrier-based devices were employed to validate diode operation, heterojunction-based p-n junctions may also be used.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present. Furthermore, a layer may be graded in alloy composition or doping level.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a high performance/wavelength configurable IR detector have been specifically described and illustrated herein, many modifications and variations will be apparent to those skilled in the art. Accordingly, it is to be understood that a high performance/wavelength configurable IR detector constructed according to principles of this invention may be embodied other than as specifically described herein. The invention is also defined in the following claims, and equivalents thereof.

What is claimed is:

1. A detector comprising:
a first collector;
a first interface layer, on the first collector;
an absorber, on the first interface layer;
a second interface layer, on the absorber; and
a second collector, on the second interface layer,
the absorber being configured to absorb photons,
the detector being configured such that both the first collector and the second collector concurrently collect minority carriers generated in the absorber.

2. The detector of claim 1, wherein:
the first interface layer comprises:
a barrier configured to block the flow of majority carriers from the absorber to the first collector; or
a p-n heterojunction; or
a p-n homojunction, and
the second interface layer comprises:
a barrier configured to block the flow of majority carriers from the absorber to the second collector; or
a p-n heterojunction; or
a p-n homojunction.

3. The detector of claim 1, comprising, as a major component, a III-V semiconductor, a II-VI semiconductor, or a group IV semiconductor.

4. The detector of claim 1, wherein the absorber comprises, as a major component, InAlSb alloy or InAsSb alloy or AlInAsSb alloy.

5. The detector of claim 1, wherein the absorber comprises a structure selected from the group consisting of InAs/InAsSb superlattices, InAs/GaSb superlattices, InAs/GaInSb superlattices, InAs/GaSb/AlSb superlattices, and combinations thereof.

6. The detector of claim 1, wherein the absorber comprises, as a major component, an n-type semiconductor or a p-type semiconductor.

7. The detector of claim 1, wherein the absorber has a uniform composition.

8. The detector of claim 1, wherein the absorber has a graded composition and a bandgap of the absorber is:
wider in a first region of the absorber, and
narrower, than in the first region, in:
a second region between the first region and the first interface layer, and
a third region between the first region and the second interface layer.

9. The detector of claim 1, wherein the absorber has a linearly graded composition.

10. The detector of claim 1, wherein the absorber has a step-graded composition.

11. The detector of claim 1, further comprising a metal contact penetrating, and electrically isolated from:
the second interface layer, and
the second collector, and
electrically connected to the absorber.

12. The detector of claim 1, further comprising:
a metal grid contact on the second collector,
the metal grid contact being electrically connected to the second collector and to the first collector.

13. The detector of claim 1, further comprising an array common layer on the first collector.

14. The detector of claim 1, further comprising:
a metal grid contact on the second collector and electrically connected to the second collector; and
an array common layer on the first collector,
wherein the metal grid contact is electrically connected to the array common layer.

15. An array detector, comprising a plurality of pixels each comprising the detector of claim 1, the pixels being separated by a plurality of trenches extending at least through the second collector, through the first interface layer, and through all intervening layers between the second collector, and the first interface layer.

16. The detector of claim 1, further comprising a metal contact penetrating, and electrically isolated from:
the second interface layer, and
the second collector, and
electrically connected to the absorber.

17. The detector of claim 1, having a recess extending through:
the first collector,
the first interface layer,
the absorber,
the second interface layer, and
the second collector,
the detector further comprising an insulating layer on an interior surface of the recess, and a planarization fill in an interior volume of the insulating layer.

18. A detector comprising:
a first collector;
a first interface layer, on the first collector;
a first absorber, on the first interface layer;
a minority carrier cross talk prevention barrier on the first absorber;
a second absorber on the minority carrier cross talk prevention barrier;
a second interface layer, on the second absorber; and
a second collector, on the second interface layer,
each of the first absorber and the second absorber being configured to absorb photons,
wherein:
the first absorber comprises, as a major component, an n-type semiconductor or a p-type semiconductor,
the second absorber comprises, as a major component, an n-type semiconductor or a p-type semiconductor,
the second absorber has a smaller bandgap than the first absorber, and
the first interface layer is a first barrier layer configured, by selection of:
a thickness of the first barrier layer, and
a doping level of the first barrier layer,
to enable the flow of minority carriers from the first absorber to the first collector upon the application of a first bias to the detector to enable tunneling of minority carriers through a barrier.

19. The detector of claim 18 further comprising a metal contact penetrating, and electrically isolated from:
the second interface layer, and
the second collector, and
electrically connected to the second absorber.

20. The detector of claim 18, wherein the second interface layer forms a second energy barrier configured to impede the flow of minority carriers from the second absorber to the second collector in the absence of a bias, and to enable the flow of minority carriers from the second absorber to the second collector upon the application of a second bias to the detector.

21. The detector of claim 18 wherein the second interface layer is a second barrier layer configured by selection of:
a thickness of the second barrier layer, and
a doping level of the second barrier layer,
to enable the flow of minority carriers from the second absorber to the second collector upon the application of a second bias to the detector.

22. The detector of claim 21, wherein the magnitude of the first bias is larger than the magnitude of the second bias.

23. The detector of claim 22, wherein the magnitude of the second bias is between 10 mV and 200 mV.

24. The detector of claim 22 configured:
to collect minority carriers from only the second absorber when a bias having a magnitude greater than the magnitude of the second bias and less than the magnitude of the first bias is applied to the detector, and
to collect minority carriers, concurrently from the first absorber and from the second absorber, when a bias with a magnitude greater than the magnitude of the first bias is applied to the detector.

25. The detector of claim 21, wherein the magnitude of the first bias is smaller than the magnitude of the second bias.

26. The detector of claim 25, wherein the magnitude of the first bias is between 10 mV and 200 mV.

27. The detector of claim 25 wherein the detector is configured:

to collect minority carriers from only the first absorber when a bias having a magnitude greater than the magnitude of the first bias and less than the magnitude of the second bias is applied to the detector, and to collect minority carriers, concurrently from the first absorber and from the second absorber, when a bias with a magnitude greater than the magnitude of the second bias is applied to the detector.

28. An array detector, comprising a plurality of pixels each comprising the detector of claim 25, the pixels being separated by a plurality of trenches extending at least through the second collector, through the first interface layer, and through all intervening layers between the second collector, and the first interface layer.

29. The detector of claim 18, having a recess extending through:
the first collector,
the first interface layer,
the first absorber,
the minority carrier cross talk prevention barrier,
the second absorber,
the second interface layer, and
the second collector,
the detector further comprising an insulating layer on an interior surface of the recess, and a planarization fill in an interior volume of the insulating layer.

30. A method of forming a detector, the method comprising:
forming a first collector;
forming a first interface layer on the first collector;
forming a first absorber on the first interface layer;
forming a second interface layer on the first absorber; and
forming a second collector on the second interface layer,
the first absorber being configured to absorb photons,
wherein the first absorber has a graded composition and a bandgap of the first absorber is:
wider in a first region of the first absorber, and
narrower, than in the first region, in:
a second region between the first region and the first interface layer, and
a third region between the first region and the second interface layer.

31. The method of claim 30, wherein:
the first interface layer comprises:
a barrier configured to impede the flow of majority carriers from the first absorber to the first collector; or
a p-n heterojunction; or
a p-n homojunction, and
the second interface layer comprises:
a barrier configured to impede the flow of majority carriers from the first absorber to the first collector; or
a p-n heterojunction; or
a p-n homojunction.

32. A method of operating a detector,
the detector comprising:
a first collector;
a first interface layer, on the first collector;
a first absorber, on the first interface layer;
a minority carrier cross talk prevention barrier on the first absorber;
a second absorber on the minority carrier cross talk prevention barrier;
a second interface layer, on the second absorber;
a second collector, on the second interface layer; and
a metal contact penetrating, and electrically isolated from, the second interface layer and the second collector,
wherein:
the second absorber has a smaller bandgap than the first absorber,
the first interface layer is a first barrier layer configured, by selection of:
a thickness of the first barrier layer, and
a doping level of the first barrier layer,
to enable the flow of minority carriers from the first absorber to the first collector upon the application of a first bias to the detector to enable tunneling of minority carriers through a barrier,
the method comprising:
absorbing, via the first absorber, photons;
enabling the flow of minority carriers, by tunneling through a barrier, from the first absorber to the first collector; and
enabling the flow of minority carriers from the second absorber to the second collector.

* * * * *